United States Patent
Zhang et al.

(10) Patent No.: US 8,933,686 B2
(45) Date of Patent: Jan. 13, 2015

(54) SINGLE-PHASE OPTICAL CURRENT TRANSFORMER

(75) Inventors: Wei Zhang, Hitachi (JP); Tatsushi Yamaguchi, Saitama (JP)

(73) Assignee: Hitachi, Ltd., Tokyo (JP)

( * ) Notice: Subject to any disclaimer, the term of this patent is extended or adjusted under 35 U.S.C. 154(b) by 170 days.

(21) Appl. No.: 13/517,493

(22) PCT Filed: Dec. 13, 2010

(86) PCT No.: PCT/JP2010/072827
§ 371 (c)(1),
(2), (4) Date: Jun. 20, 2012

(87) PCT Pub. No.: WO2011/078096
PCT Pub. Date: Jun. 30, 2011

(65) Prior Publication Data
US 2012/0262150 A1    Oct. 18, 2012

(30) Foreign Application Priority Data
Dec. 21, 2009  (JP) .................................. 2009-288765

(51) Int. Cl.
*G01R 31/00*  (2006.01)
*G01R 15/24*  (2006.01)
(52) U.S. Cl.
CPC .................................... *G01R 15/246* (2013.01)
USPC ...................... 324/96; 324/117 R; 324/117 H
(58) Field of Classification Search
CPC .......... G01R 19/00; G01R 31/00; G01R 15/00
USPC .............................. 324/96, 117 H, 356, 117 R
See application file for complete search history.

(56) References Cited

U.S. PATENT DOCUMENTS

| | | | | | |
|---|---|---|---|---|---|
| 5,295,207 | A | * | 3/1994 | Dupraz et al. | 385/12 |
| 5,719,497 | A | * | 2/1998 | Veeser et al. | 324/174 |
| 5,844,410 | A | * | 12/1998 | Ikuta et al. | 324/96 |
| 5,933,000 | A | * | 8/1999 | Bosselmann et al. | 324/96 |

(Continued)

FOREIGN PATENT DOCUMENTS

| | | | |
|---|---|---|---|
| JP | 3-105259 A | 5/1991 | |
| JP | 4-50633 A | 2/1992 | |

(Continued)

OTHER PUBLICATIONS

International Search Report with English translation dated Mar. 15, 2011 (four (4) pages).

(Continued)

*Primary Examiner* — Arleen M Vazquez
*Assistant Examiner* — Neel Shah
(74) *Attorney, Agent, or Firm* — Crowell & Moring LLP

(57) ABSTRACT

An installation base is secured to part of outer peripheral surface of cylindrical container 1 which has electric conductor 2 arranged thereinside, and a case which stores a Faraday-effect element is detachably secured to the installation base. Faraday-effect element 10 having two optical fibers 24A, 24B of prescribed dimensions, to provide first and second optical paths 11A, 11B maintained in parallel with a predetermined interval therebetween and placed so as to intersect axial direction of electric conductor 2, and having mirror 12 which reflects linearly polarized light at one end surface of each optical fiber. Linearly polarized light from the same light source injected into each of the optical paths 11A, 11B, and current flowing in electric conductor 2 is measured base on the Faraday rotation angle of the linearly polarized light reflected and returned from mirror 12.

2 Claims, 5 Drawing Sheets

(56) References Cited

U.S. PATENT DOCUMENTS

| | | | |
|---|---|---|---|
| 6,281,672 B1 * | 8/2001 | Terai et al. | 324/96 |
| 6,297,625 B1 * | 10/2001 | Bosselmann et al. | 324/96 |
| 6,512,357 B2 * | 1/2003 | Bosselmann et al. | 324/96 |
| 7,339,680 B2 * | 3/2008 | Bohnert et al. | 356/483 |

FOREIGN PATENT DOCUMENTS

| | | | | |
|---|---|---|---|---|
| JP | 7-248338 A | 9/1995 | | |
| JP | 2001-324518 A | 11/2001 | | |
| JP | 2003-232815 A | 8/2003 | | |
| JP | 02003232815 | * | 8/2003 | G01R 15/24 |

OTHER PUBLICATIONS

Form PCT/ISA/237 (three (3) pages).
English Translation of Written Opinion dated Mar. 15, 2011 with International Preliminary Report on Patentability (eleven (11) pages).

* cited by examiner

SINGLE-PHASE OPTICAL CURRENT TRANSFORMER

TECHNICAL FIELD

The present invention relates to a single-phase optical current transformer particularly to such a single-phase optical current transformer as is capable of measuring reliably single-phase large currents.

BACKGROUND ART

To measure current flowing through an electric conductor of high-voltage in a gas insulated switch gear (hereinafter referred to as GIS) or similar apparatus, a wound-type current transformer has been conventionally used. The transformer of such type is a through-type current transformer comprised of an endless core and a secondary winding through which the electric conductor passes. However, the wound-type current transformer is large in size and heavy in weight. Because of this, consideration has been made about application of an optical current transformer that uses the Faraday effect, which is a rotation phenomenon of polarization plane of a light due to an effection of magnetic field. Such optical current transformer is suitable particularly for measuring single-phase current the measuring which will not be affected from magnetic field of the other phase.

As a usual configuration in a single-phase optical current transformer, an optical path is provided around an electrical conducting body through which current to be measured flows. With this configuration, current is measured as follows: When linearly polarized light from a light source is allowed to pass through the optical path, the effection of magnetic field of the current flowing through the electrical conducting body causes a rotation of the plane of polarization of such light because of the Faraday effect. A detector provided at the detection end of the optical path detects the Faraday rotation angle and thereby measures amount of the current.

One style of a single-phase optical current transformer can be found in for example JP 03-105259 A1 (Patent Literature 1), wherein a block of lead glass is used as the Faraday-effect element. In this single-phase optical current transformer, the optical path is formed around an electric conductor, through which current flows, by arranging assembled blocks of lead glass. Through this optical path, linearly polarized light from a light source is allowed to pass and amount of change in the Faraday rotation angle caused by the effection of magnetic field of the current in the electric conductor is detected with a detector to measure the current.

The other style of a single-phase optical current transformer can be found in for example JP 07-248338 A1 (Patent Literature 2), wherein an optical fiber is used as the Faraday-effect element. In this single-phase optical current transformer, the optical path is formed in a closed loop configuration using an optical fiber arranged encircling the electric conductor. Current measuring is performed in a similar manner to the method stated above using linearly polarized light allowed to pass through the optical path.

The optical current transformer of which optical path is fabricated using block-shaped lead glass is hard to manufacture in a smaller size and requires complicate fabrication process. Because of this, such a single-phase optical current transformer as uses an optical fiber for configuring the optical path has been considered advantageous.

In this connection, it is known that there are two types of single-phase optical current transformers having optical paths of closed loop using optical fibers; one is a reflection type and the other is a transmission type. In the reflection type, the Faraday rotation angle of the linearly polarized light passed through the optical path is detected on the returning light reflected in the optical path. In the transmission type, the Faraday rotation angle of the linearly polarized light passed through the optical path is detected on the light transmitted through the optical path.

On the other hand, GISs are becoming high in their voltage rating and, due to that, also becoming large in capacity and size. As a consequence of that, the diameter of the cylindrical container, in which the electric conductor is accommodated with insulating gas filled, has become large. Because of this, in the single-phase optical current transformer to be installed on a GIS, the optical path of closed loop using optical fiber is required to be installed outside or inside the cylindrical container of a large diameter.

Both of the conventional single-phase optical current transformers stated above have optical paths of closed loop using Faraday-effect elements. Therefore, when a large current such as fault current flows through the electric conductor, the effection of magnetic field by such heavy current will cause saturation in the size of Faraday rotation angle of the linearly polarized light propagating through the optical path. As a consequence of this, a problem arises in that the accurate measuring of current that bases on the Faraday rotation angle measured on the detector end becomes impracticable.

Further, the conventional single-phase optical current transformer has been required to have the optical path of closed loop using a Faraday-effect element in such a configuration that the path encircles the electric conductor. Therefore, there has been a problem in that, where an optical path of closed loop using optical fiber is required to be installed outside or inside the cylindrical container like in a GIS, placing such device in required position encounters a poor workability and is not easy. Moreover, temperature difference appears between the upper part and the lower part of the cylindrical container due to direct sunlight or temperature rise of the electric conductor. This temperature difference invites also temperature difference in the Faraday-effect element between its upper and lower parts connecting to the measuring error. Likewise, this problem arises even in the case where an optical fiber, which is light in weight, is used as the Faraday-effect element.

An object of the present invention is to provide a single-phase optical current transformer having features: such that saturation in the size of Faraday rotation angle of the linearly polarized light propagating through a first and a second short optical paths hardly occurs even when a heavy current such as fault current flows through an electric conductor, and therefore large electrical current in such electric conductor is measured reliably; and such that economical manufacturing in a compact size is practicable.

Another object of the present invention is to provide a single-phase optical current transformer easy to install on a part of the outer peripheral surface of a cylindrical container with eased assembling and replacing operation.

DISCLOSURE OF INVENTION

The single-phase optical current transformer by the present invention comprising: a cylindrical container; an electric conductor being arranged inside the cylindrical container; a Faraday-effect element being provided on the cylindrical container, the Faraday-effect element forming an optical path for linearly polarized light to measure electrical current flowing through the electric conductor based on the Faraday rotation angle of the linearly polarized light that passes through the optical path; the Faraday-effect element having two optical fibers of prescribed dimensions and mirrors, each of the optical fiber forming a first optical path and a second optical path respectively, each of the optical paths being placed so as to intersect with the axial direction of the electric conductor, each of the optical paths being maintained parallel to each other at a predetermined interval, each of the mirror being provided at the one end surface of the each optical fiber respectively, each of the mirror reflecting the linearly polarized light, wherein each of the linearly polarized lights from the same light source are injected into each of the optical path respectively, and the current flowing through the electric conductor is measured based on each of the Faraday rotation angle of the linearly polarized light which is reflected from the mirror.

The single-phase optical current transformer by the present invention comprising: a cylindrical container; an electric conductor being arranged inside the cylindrical container; a Faraday-effect element being provided on the cylindrical container, the Faraday-effect element forming an optical path for linearly polarized light to measure electrical current flowing through the electric conductor based on the Faraday rotation angle of the linearly polarized light that passes through the optical path; an installation base being secured to a part of the outer peripheral surface of the cylindrical container; a case being detachably secured to the installation base, the case storing the Faraday-effect element therein; the Faraday-effect element having two optical fibers of prescribed dimensions and mirrors, each of the optical fiber forming a first optical path and a second optical path respectively, each of the optical paths being placed so as to intersect with the axial direction of the electric conductor, each of the optical paths being maintained parallel to each other at a predetermined interval, each of the mirror being provided at the one end surface of the each optical fiber respectively, each of the mirror reflecting the linearly polarized light, wherein each of the linearly polarized lights from the same light source are injected into each of the optical path respectively, and the current flowing through the electric conductor is measured based on each of the Faraday rotation angle of the linearly polarized light which is reflected from the mirror.

It is preferable that a position fixing base is arranged inside the case and each of the optical fibers is arranged on the position fixing base with a protecting tube applied thereon.

Advantageous Effects of Invention

Since the single-phase optical current transformer by the present invention uses optical fibers of prescribed dimensions as the Faraday-effect elements, the length of the first and the second optical paths can be made shorter. Therefore, saturation in the size of Faraday rotation angle of the linearly polarized light hardly occurs. This feature offers such an advantageous effect that a large current that may flow on fault for example can be reliably measured. In addition, the influence on the measuring accuracy attributable to temperature variation can be reduced, because the measurement is performed over a smaller area of magnetic field by detecting the Faraday rotation angle of the linearly polarized light propagating through the first and the second optical paths formed by the optical fibers of short length. Moreover, it is practicable to downsize a single-phase optical current transformer and therefore the invented art has an advantage in that an economical manufacturing thereof is feasible.

Furthermore, the single-phase optical current transformer by the present invention has the configuration wherein the installation base is secured to a part of the outer peripheral surface of the cylindrical container, the optical fibers as the Faraday-effect elements are stored in the case detachably secured to the installation base, and the first and the second optical paths are placed so as to intersect with the axial direction of the electric conductor in the cylindrical container with an arrangement in which they maintain being parallel to each other at a predetermined interval. Therefore, the invented single-phase optical current transformer can be fabricated and installed separately from the electric conductor offering to eased fabrication and replacement operation.

BEST MODE FOR CARRYING OUT THE INVENTION

The single-phase optical current transformer by the present invention has a Faraday-effect element, which forms an optical path for linearly polarized light, on the part of the outer peripheral surface of a cylindrical container, and an electrical conducting body is arranged in the cylindrical container. The Faraday-effect element has two optical fibers of prescribed dimensions, which form a first optical path and a second optical path respectively, the first optical path and the second optical path being placed so as to intersect with the axial direction of the electric conductor with an arrangement in which they maintain being parallel to each other at a predetermined interval, wherein a mirror which reflects linearly polarized light is provided at one end surface of each optical fiber. In this configuration, linearly polarized lights from the same light source are injected severally into each of the first and the second optical paths and the Faraday rotation angle of the linearly-polarized light reflected by the mirror is used to measure the current flowing through the electric conductor.

Figure 1:
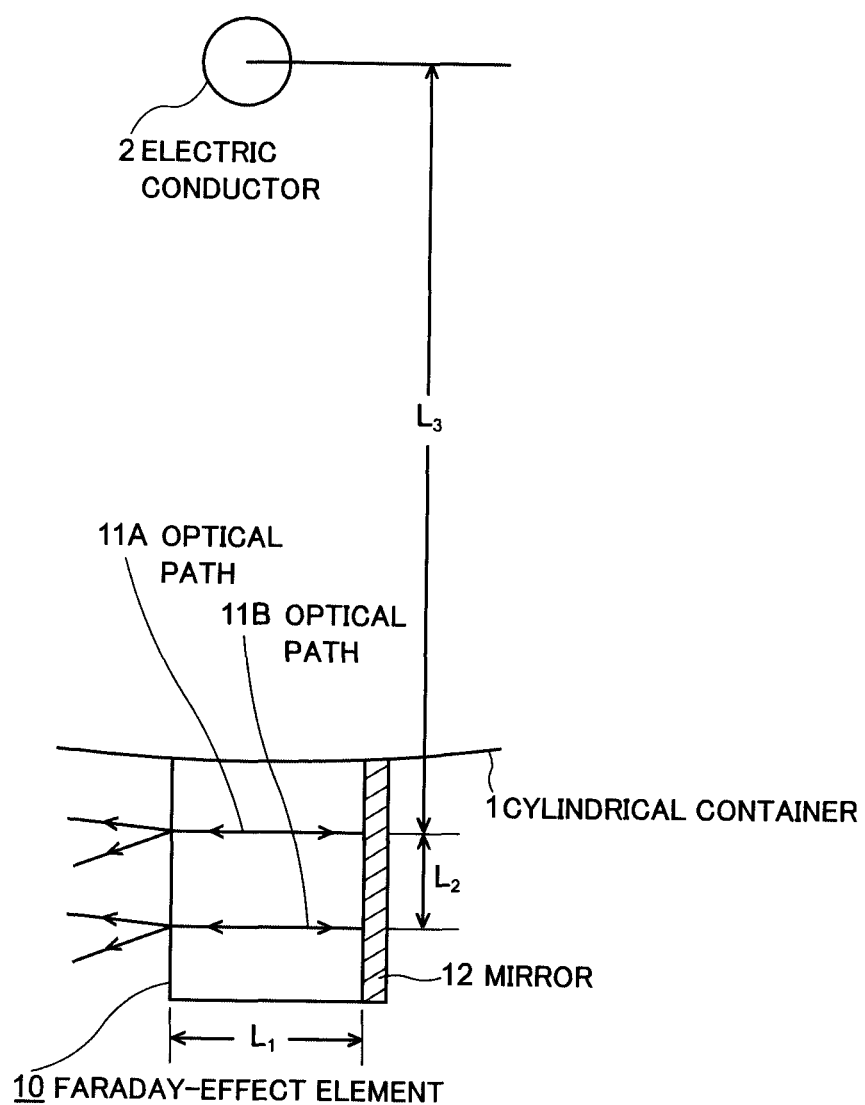
FIG. 1 is an explanatory principle diagram to illustrate the single-phase optical current transformer by the present invention.

First, the principle of the single-phase optical current transformer by the present invention will be explained one by one referring to FIG. 1 that is a schematic vertical sectional view. In the invented single-phase optical current transformer, on a part of a cylindrical container 1, inside which an electric conductor 2 is arranged, a Faraday-effect element 10 is placed being intersect, when sectionally viewed, to the axial direction of the electric conductor 2; in other word, the Faraday-effect element 10 is disposed so as to be intersected to the direction the current.

The Faraday-effect element 10 is used in a small-sized style having a dimension $L_1$ of narrow width, as will be explained later. As the Faraday-effect element 10, a first optical path 11A and a second optical path 11B of the same length are used. These two of optical paths 11A and 11B are disposed in order that they will maintain a prescribed mutual separation distance of $L_2$, or will be parallel to each other. Thereby, the distance between the center of the electric conductor 2 inside the cylindrical container 1 and the first optical path 11A is defined as $L_3$.

A mirror 12 is provided on one end of each of the optical paths 11A and 11B. The linearly polarized lights passed severally through each of the optical paths 11A and 11B are reflected at the mirror 12 to return respectively through the two of optical paths 11A and 11B. The mirror 12 provided on one end of the Faraday-effect element 10 may be formed by sticking a reflective film or by vapor-deposition of reflective material or may be formed using a mirror of glass separately manufactured instead.

Since the linearly polarized lights go and return respectively through each of the optical path 11A and 11B as stated above, the dimension $L_1$ of the Faraday-effect element 10 can be reduced to a dimension small but large enough to obtain acceptable size of the Faraday rotation angle of the linearly polarized light such that the effection of magnetic field produced by the current flowing through the electric conductor 2 will cause during the go-and-return propagation of the light. The dimension $L_1$ is far small compared to the outer peripheral dimensions of the cylindrical container 1, that is $L_1 \ll 2\pi L_3$.

Practical dimensions of $L_1$, $L_2$, and $L_3$ in installing on the cylindrical container 1 are such that the thickness dimension $L_1$ of the Faraday-effect element is 10 mm to 500 mm, the dimension $L_2$ between the first optical path and the second optical path is 10 mm to 200 mm, and the dimension $L_3$ between the first optical path in the Faraday-effect element and the center of the electric conductor is 100 mm to 1000 mm. Their exact dimensions are determined according to the size of the cylindrical container 1.

Although the figures do not illustrate because the arrangement is the same as in the conventional art, each of the two of optical paths 11A and 11B has a polarizer on its light injection side connected to the same light source, and has an analyzer on its light emission side as a detector of the Faraday rotation angle of the linearly polarized light; the single-phase optical current transformer by the present invention is constructed in this manner.

The linearly polarized lights from the same light source are made to pass severally through the optical paths 11A and 11B as arrows in the figure show. The light traveled through the respective optical path is reflected at the mirror 12 provided on the end of the path to return through the path, the optical paths 11A and 11B respectively. The measurement of current is determined by a calculation performed on the detector (not shown) based on the Faraday rotation angles of two go-and-return linearly polarized lights caused by the effection of magnetic field resulted from the flow of current.

The Faraday-effect element 10 used in the single-phase optical current transformer by the present invention is prone to cause errors due to the influence of the dimension $L_3$, because the size of the member is small. Therefore, the two of optical paths of the same length 11A and 11B are provided to eliminate such influence, and measuring uses both the two of optical paths 11A and 11B. The current flowing through the electric conductor 2 inside the cylindrical container 1 is measured by the detector in a manner described below based on the Faraday rotation angles of the linearly-polarized lights obtained severally from both of the optical paths 11A and 11B.

It is well known that the size of the Faraday rotation angle $\theta$ of the Faraday-effect element 10 does not saturate when $\theta = VHL < 45°$, where V is Verdet constant, H is intensity of magnetic field, and L is length of optical path. In other words, this means that the Faraday rotation angle $\theta$ is proportional to the optical path length L when Verdet constant V and the intensity of magnetic field H are fixed. When the dimension $L_1$ of the Faraday-effect element 10 is $L_3/20$ for example, the Faraday rotation angle $\theta$ is less than 1° ($\theta < 1°$) not reaching saturations in the single-phase optical current transformer by the present invention, even when such a current as will cause 45° of the Faraday rotation angle $\theta$ in a conventional type of optical current transformer flows.

Next, the measuring of current using the two of optical paths 11A and 11B arranged inside the Faraday-effect element 10 that are disposed maintaining being parallel to each other at the dimension $L_2$ will be explained. When the Faraday rotation angles of the linearly polarized lights passed severally through each of the optical paths 11A and 11B are expressed as $\theta_1$ and $\theta_2$ respectively, and the intensities of magnetic field on each of the optical paths 11A and 11B are expressed as $H_1$ and $H_2$ respectively, then:

$$\theta_1 = VH_1L_1$$

and $$\theta_2 = VH_2L_1$$

where $H_1 = I/(2\pi L_3)$ and $H_2 = I/(2\pi(L_2+L_3))$.

From these expressions, the formula that gives the current I flowing through the electric conductor 2 is derived as follows:

$$I = 2\pi\theta_1\theta_2 L_2/(\theta_1-\theta_2)VL_1.$$

Using this formula, the current flowing through the electric conductor 2 is accurately measured. Thus, the using of the two of optical paths 11A and 11B of the same length permits current measurement by a calculation performed on the detector side without influence of dimensional error of the dimension $L_3$ and without saturation problem in the measurement of the Faraday rotation angle even when a large current like a fault current flows.

Embodiment 1

Details of the single-phase optical current transformer by the present invention will be explained referring to FIGS. 2 to 5 that illustrate an example of an application to GIS or gas insulated buses. The cylindrical container 1, inside which the electric conductor 2 is accommodated, maintains electrical insulation by insulation gas filled therein.

Figure 2:
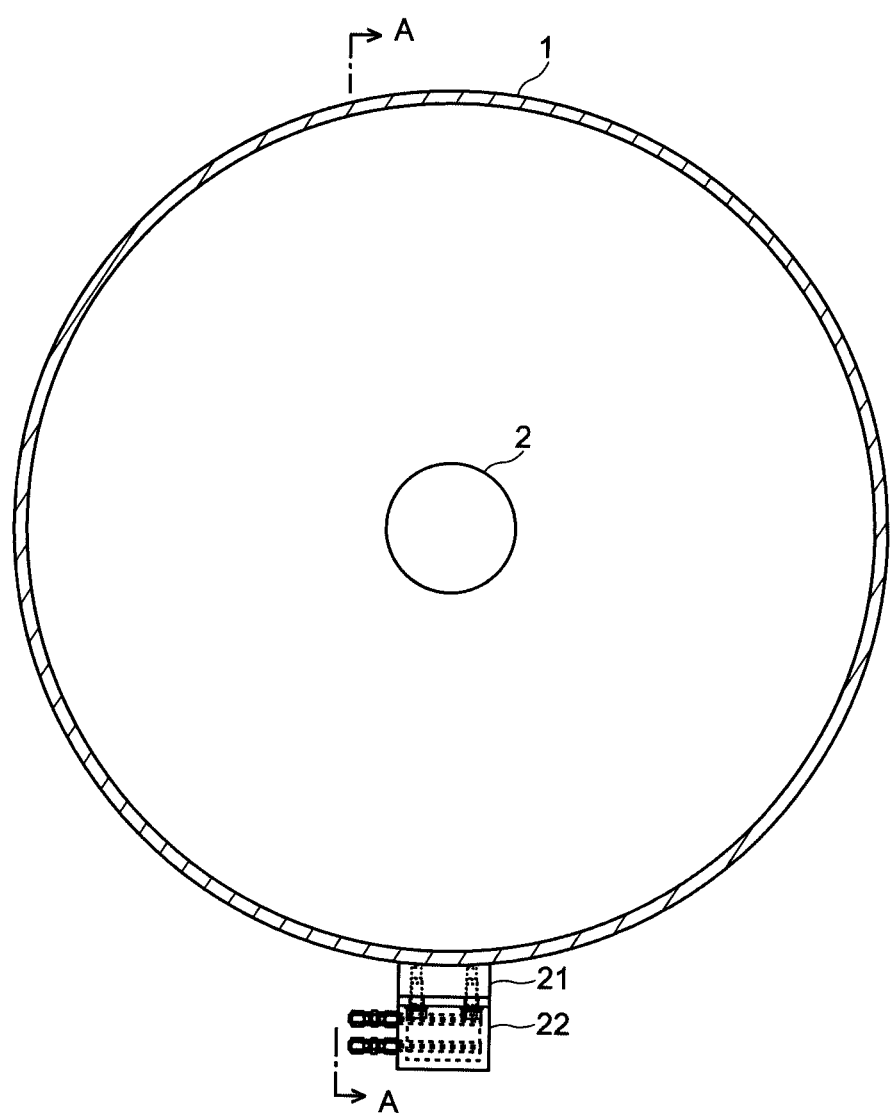
FIG. 2 is a schematic vertical sectional view to illustrate an embodiment of the single-phase optical current transformer to which the present invention is applied.
Figure 3:
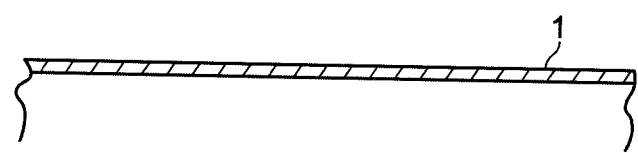
FIG. 3 is a schematic sectional view of the single-phase optical current transformer illustrated in FIG. 2 as viewed from the line A-A.
Figure 3:
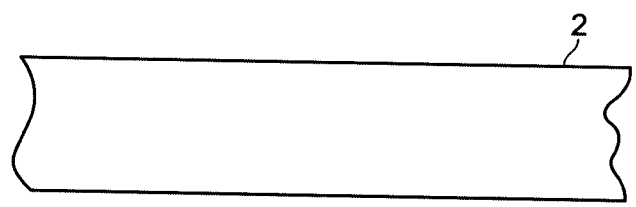
Figure 3:
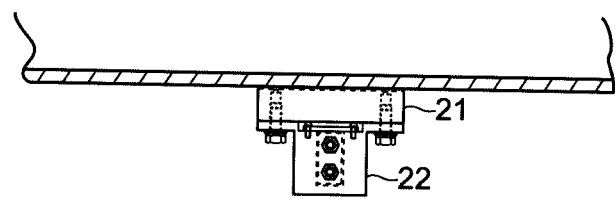
Figure 4:
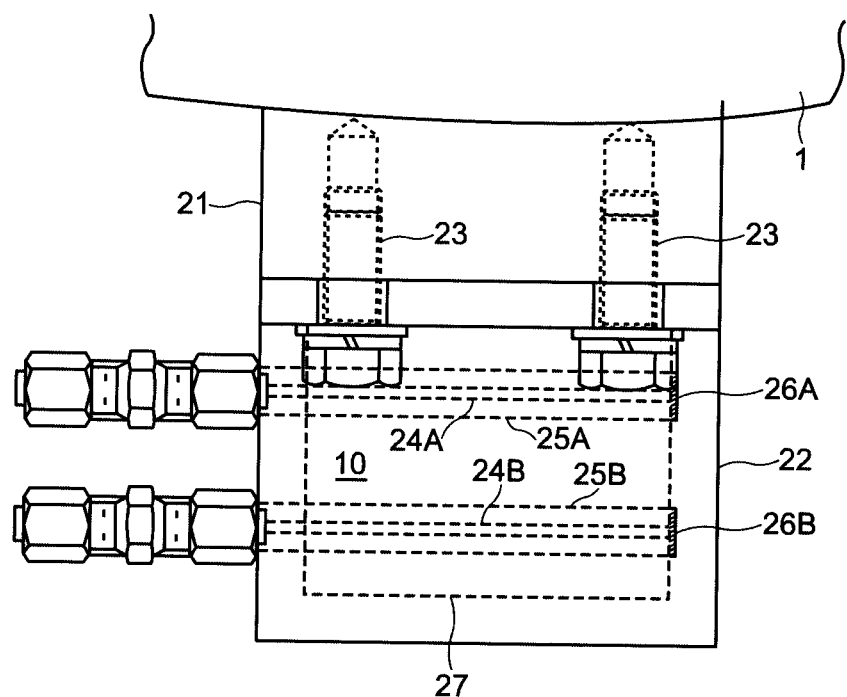
FIG. 4 is an enlarged view of the principal part of the object illustrated in FIG. 2.
Figure 5:
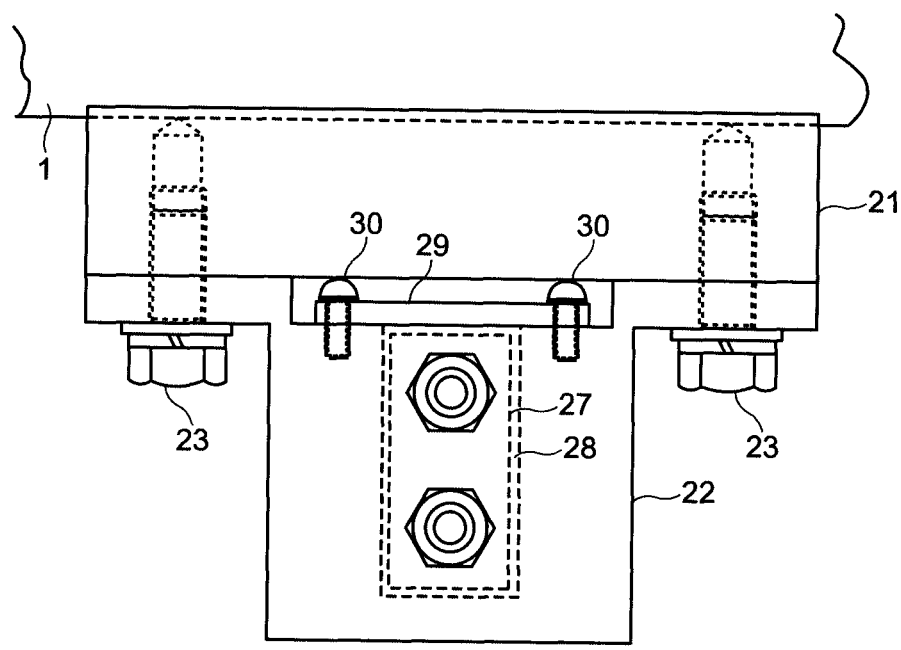
FIG. 5 is a left side view of the object illustrated in FIG. 4.

An installation base 21 is secured on the part of the outer peripheral surface of the cylindrical container 1 with welding, or with other suitable method, namely on the undersurface of the cylindrical container 1 with less subject to direct sunlight in this example as illustrated in FIG. 2 and FIG. 3. The manner of attaching is such that, when viewed in the cross-sectional direction, the seat of the installation base 21 is intersect with the axial direction of the electric conductor 2 through which current flows. A case 22 in which the Faraday-effect element 10 is to be stored is detachably secured on the seat of the installation base 21 using bolts 23.

As the Faraday-effect element 10 stored in the case 22, the two of optical fibers 24A and 24B are used in the example illustrated in FIGS. 2 to 5. These optical fibers 24A and 24B are the same in their lengths and form the first optical path and the second optical path respectively with an arrangement of being parallel to each other. These parallel-arranged optical fibers are placed so as to intersect with the axial direction of the electric conductor 2, namely the direction of the flow of current.

Likewise as stated above, the optical fibers 24A and 24B, which form the first optical path and the second optical path respectively, severally have mirrors 26A and 26B on each end surface opposite to the injection side of the linearly polarized light to configure reflection type devices in order that the linearly polarized lights will severally go and return in the optical fibers 24A and 24B.

The two of optical fibers 24A and 24B are arranged on a position fixing base 27 in order that they will be positioned at the state in which no dimensional variation occurs, with protective tubes 25A and 25B applied thereon as cushioning material. And then, they are disposed inside the case 22 through its opening on the top after being applied a cushioning material 28.

The opening of the case 22 is shut with a case cover 29, which is fastened using screws 30; and then, the case 22 is detachably secured on the installation base 21 attached on the outer peripheral surface of the cylindrical container 1.

A light receiving optical fiber and a light transmitting optical fiber (neither is illustrated) are connected to each of the two of optical fibers 24A and 24B, which form the first optical path and the second optical path respectively, via a device such as a connection terminal board to be mounted on the case 22 to constitute the single-phase optical current transformer.

By constituting a single-phase optical current transformer in this way, the magnitude of current can be accurately determined by a calculation performed on the detector side based on the two of Faraday rotation angles of the linearly polarized lights from the same light source that go and return severally through the first optical path and the second optical path, because such Faraday rotation is the result of the effection of the magnetic field generated by the current flowing through the electric conductor acting on such lights during their go-and-return propagation through the optical paths. Further, since the path length of go-and-return of the linearly polarized lights through the optical fibers 24A and 24B is short, the Faraday rotation angle does not reach saturation even if a large current flows through the electric conductor, which enables the current measuring to be carried out without problems.

The installation base 21 attached to a part of the outer peripheral surface of the cylindrical container 1 may be installed using a flange formed on the cylindrical container 1 in its axial direction. Whichever is the installation position, the place of installation should be such a location that temperature rise due to being subjected to direct sunlight will not easily occur on the optical paths formed by the optical fibers 24A and 24B, the Faraday-effect element, stored in the case 22 to be secured on the installation base 21 in order that measuring error attributable to the temperature variation will not be involved.

INDUSTRIAL APPLICABILITY

The single-phase optical current transformer by the present invention is applicable not only to GIS but also easily to other gas insulated electrical apparatuses such as gas insulated switchgears for example.

The invention claimed is:

1. A single-phase optical current transformer comprising:
    a cylindrical container;
    an electric conductor being arranged inside the cylindrical container; and
    a Faraday-effect element being provided on the cylindrical container;
    the Faraday-effect element having two optical fibers and a mirror, each of the optical fibers being provided outside the cylindrical container, the optical fibers forming a first optical path and a second optical path respectively, each of the optical paths being provided outside the cylindrical container, each of the optical paths being placed so as to intersect with the axial direction of the electric conductor, the optical paths being maintained parallel to each other at a predetermined interval, the second optical path being provided farther from an axis of the electric conductor than the first optical path, the mirror being provided at a respective end surface of each of the optical fibers, the mirror reflecting linearly polarized light, wherein:
    linearly polarized lights from the same light source are injected respectively into the optical paths formed outside the cylindrical container, and the current flowing through the electric conductor is measured based on each of the Faraday rotation angles of the linearly polarized lights which are reflected by the mirror,
    a first linearly polarized light from the light source is injected into the first optical path and reflected by the mirror such that the first linearly polarized light returns along the first optical path, and
    a second linearly polarized light from the light source is injected into the second optical path and reflected by the mirror such that the second linearly polarized light returns along the second optical path.

2. A single-phase optical current transformer comprising:
    a cylindrical container;
    an electric conductor being arranged inside the cylindrical container;
    a Faraday-effect element being provided on the cylindrical container;
    an installation base being secured to a part of the outer peripheral surface of the cylindrical container; and
    a case being detachably secured to the installation base, the case storing the Faraday-effect element therein;
    the Faraday-effect element having two optical fibers and two mirrors, each of the optical fibers being provided outside the cylindrical container, the optical fibers forming a first optical path and a second optical path respectively, each of the optical paths being provided outside the cylindrical container, each of the optical paths being placed so as to intersect with the axial direction of the electric conductor, the optical paths being maintained parallel to each other at a predetermined interval, the second optical path being farther from an axis of the electric conductor than the first optical path, each of the mirrors reflecting linearly polarized light, wherein:
    linearly polarized lights from the same light source are injected respectively into the optical paths formed outside the cylindrical container, and the current flowing through the electric conductor is measured based on each of the Faraday rotation angles of the linearly polarized lights which are reflected respectively by the mirrors,
    a first linearly polarized light from the light source is injected into the first optical path and reflected by a first one of the mirrors such that the first linearly polarized light returns along the first optical path, and
    a second linearly polarized light from the light source is injected into the second optical path and reflected by a second one of the mirrors such that the second linearly polarized light returns along the second optical path.

* * * * *